United States Patent
Zhou et al.

(10) Patent No.: US 11,973,094 B2
(45) Date of Patent: Apr. 30, 2024

(54) ARRAY SUBSTRATE WITH LIGHT SHIELDING, ELECTRONIC DEVICE AND MANUFACTURING METHOD OF ARRAY SUBSTRATE WITH LIGHT SHIELDING

(71) Applicant: BOE TECHNOLOGY GROUP CO., LTD., Beijing (CN)

(72) Inventors: Tianmin Zhou, Beijing (CN); Rui Huang, Beijing (CN); Wei Yang, Beijing (CN); Lizhong Wang, Beijing (CN); Zhaohui Qiang, Beijing (CN); Tao Yang, Beijing (CN); Li Qiang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 474 days.

(21) Appl. No.: 17/290,495

(22) PCT Filed: Sep. 23, 2020

(86) PCT No.: PCT/CN2020/117062
§ 371 (c)(1),
(2) Date: Apr. 30, 2021

(87) PCT Pub. No.: WO2021/068745
PCT Pub. Date: Apr. 15, 2021

(65) Prior Publication Data
US 2021/0408095 A1 Dec. 30, 2021

(30) Foreign Application Priority Data
Oct. 11, 2019 (CN) .......................... 201910961564.4

(51) Int. Cl.
*H01L 27/146* (2006.01)
*G06V 40/13* (2022.01)
(Continued)

(52) U.S. Cl.
CPC .... *H01L 27/14616* (2013.01); *G06V 40/1318* (2022.01); *H01L 27/14603* (2013.01);
(Continued)

(58) Field of Classification Search
CPC ... H10K 59/65; H10K 59/60; H01L 27/14692
See application file for complete search history.

(56) References Cited

U.S. PATENT DOCUMENTS 11,469,341 B2 * 10/2022 Bu .................... H01L 27/14609
2004/0229408 A1 11/2004 Chang
(Continued)

FOREIGN PATENT DOCUMENTS

CN 101946328 A 1/2011
CN 105867696 A 8/2016
(Continued)

OTHER PUBLICATIONS

First Office Action and Search Report dated Jun. 28, 2021 for application No. CN201910961564.4 with English translation attached.

*Primary Examiner* — Nduka E Ojeh
(74) *Attorney, Agent, or Firm* — Nath, Goldberg & Meyer; Joshua B. Goldberg

(57) ABSTRACT

The present disclosure provides an array substrate, an electronic device and a manufacturing method of the array substrate. The array substrate includes a base substrate, and a first transistor and a second transistor on the base substrate, a first electrode of the first transistor being connected to a second electrode of the second transistor; the array substrate further includes a photodiode including a first electrode, a second electrode, and a photosensitive layer between the first electrode and the second electrode, and the first electrode is electrically connected to a gate of the first transistor. In the arrangement, the first transistor and the second transistor are connected in series to form one control unit, (Continued)

and the uniformity and stability of the control unit are greatly improved.

18 Claims, 8 Drawing Sheets

(51) Int. Cl.
*H10K 59/12* (2023.01)
*H10K 59/65* (2023.01)
*H10K 71/00* (2023.01)

(52) U.S. Cl.
CPC ....... *H01L 27/14692* (2013.01); *H10K 59/65* (2023.02); *H10K 71/00* (2023.02); *H10K 59/12* (2023.02); *H10K 59/1201* (2023.02)

(56) References Cited

U.S. PATENT DOCUMENTS

| | | | |
|---|---|---|---|
| 2018/0300527 A1* | 10/2018 | Wang | H01L 27/14612 |
| 2021/0066364 A1* | 3/2021 | Lu | H01L 27/14678 |
| 2021/0305354 A1* | 9/2021 | Son | H10K 71/00 |

FOREIGN PATENT DOCUMENTS

| | | | |
|---|---|---|---|
| CN | 105977268 A | 9/2016 | |
| CN | 106449653 A | 2/2017 | |
| CN | 106971172 A | 7/2017 | |
| CN | 107123654 A | 9/2017 | |
| CN | 107579101 A | 1/2018 | |
| CN | 108376250 A | 8/2018 | |
| CN | 109686808 A | 4/2019 | |
| CN | 110634890 A | 12/2019 | |

* cited by examiner

ARRAY SUBSTRATE WITH LIGHT SHIELDING, ELECTRONIC DEVICE AND MANUFACTURING METHOD OF ARRAY SUBSTRATE WITH LIGHT SHIELDING

CROSS REFERENCE TO RELATED APPLICATION

This is a National Phase Application filed under 35 U.S.C. 371 as a national stage of PCT/CN2020/117062, filed Sep. 23, 2020, an application claiming the benefit of Chinese Application No. 201910961564.4, filed Oct. 11, 2019, the content of each of which is hereby incorporated by reference in its entirety.

TECHNICAL FIELD

The present disclosure relates to the field of display technology, more particularly, to an array substrate, an electronic device and a manufacturing method of the array substrate.

BACKGROUND

With the development of technology, smart devices with narrow bezels and high screen-to-body ratios are becoming more and more popular among customers, prompting designers to integrate functional modules (e.g., fingerprint recognition modules) of smart devices that need to occupy bezel space into a display panel.

However, a transistor in a display panel is usually a single metal oxide transistor or a single low-temperature polysilicon transistor. When the transistor in the display panel is a single metal oxide transistor, the metal oxide transistor is connected to a photodiode, and the metal oxide transistor has poor stability. When the transistor in the display panel is a single low-temperature polysilicon transistor, the low-temperature polysilicon transistor is connected to a photodiode, and the low-temperature polysilicon transistor has a high leakage current and poor uniformity. Neither of them can achieve good integration of functional modules into the display panel while ensuring normal display of the display panel.

SUMMARY

The present application provides an array substrate, an electronic device, and a manufacturing method of the array substrate, which can improve uniformity and stability of a control unit composed of a first transistor and a second transistor.

According to a first aspect of the present application, there is provided an array substrate including a base substrate, and a first transistor and a second transistor on the base substrate, a first electrode of the first transistor being connected to a second electrode of the second transistor:
  wherein the first transistor is a low-temperature polysilicon transistor, and the second transistor is a metal oxide transistor; and
  the array substrate further includes a photodiode, the photodiode includes a first electrode, a second electrode, and a photosensitive layer between the first electrode and the second electrode, and the first electrode of the photodiode is electrically connected to a gate of the first transistor.

In some embodiments, the first electrode of the photodiode is on a side of the photosensitive layer close to the first transistor, the first electrode of the photodiode is a metal electrode, and an orthographic projection of the first electrode of the photodiode on the base substrate covers orthographic projections of the first transistor and the second transistor on the base substrate.

In some embodiments, a first passivation layer and a first planarization layer are sequentially arranged between the photodiode and the first transistor, and a first through hole penetrating through the first passivation layer and the first planarization layer is arranged in the first passivation layer and the first planarization layer, the first through hole is filled with a first connection electrode, the first electrode of the photodiode is electrically connected to the gate of the first transistor through the first connection electrode.

In some embodiments, the first transistor is a top-gate transistor, and includes a low-temperature polysilicon active layer, the gate, a first interlayer insulating layer, a second interlayer insulating layer, and a source and a drain sequentially on the base substrate, a second through hole is provided in the first interlayer insulating layer and the second interlayer insulating layer, the second through hole is filled with a second connection electrode, and the second connection electrode is electrically connected to the first connection electrode and the gate of the first transistor.

In some embodiments, the second transistor includes a light-shielding layer, a metal oxide active layer, a gate, the second interlayer insulating layer, and a source and a drain sequentially on the base substrate, the light-shielding layer and the gate of the first transistor are arranged in a same layer, and the source and the drain of the second transistor, the source and the drain of the first transistor, and the second connection electrode are arranged in a same layer.

In some embodiments, an orthographic projection of the light-shielding layer on the base substrate covers an orthographic projection of the metal oxide active layer of the second transistor on the base substrate.

In some embodiments, the photodiode is a PIN photodiode.

In some embodiments, the array substrate further includes a light-emitting device on a side of the photodiode away from the base substrate, and an orthographic projection of the light-emitting device on the base substrate and an orthographic projection of the photodiode on the base substrate do not overlap.

In some embodiments, a second planarization layer and a second passivation layer are sequentially arranged between the light-emitting device and the photodiode, and a first lead is on a side of the second passivation layer away from the second planarization layer, the first lead is electrically connected to the second electrode of the photodiode through a seventh through hole penetrating through the second planarization layer and the second passivation layer, and the light-emitting device includes an anode layer, a light-emitting layer, and a cathode layer, and the anode layer and the first lead are arranged in a same layer.

In some embodiments, the array substrate further includes a third transistor and a fourth transistor, the third transistor is a low-temperature polysilicon transistor, the fourth transistor is a metal oxide transistor, a second electrode of the third transistor is electrically connected to a first electrode of the fourth transistor, and a second electrode of the fourth transistor is electrically connected to the light-emitting device.

According to a second aspect of the present application, there is provided an electronic device including the array substrate as described above.

According to a third aspect of the present application, there is provided a manufacturing method of an array substrate, including steps of:
　　providing a base substrate;
　　forming a first transistor and a second transistor on the base substrate; and
　　forming a photodiode;
　　wherein a first electrode of the first transistor is connected to a second electrode of the second transistor;
　　the first transistor is a low-temperature polysilicon transistor, and the second transistor is a metal oxide transistor; and
　　the photodiode includes a first electrode, a second electrode, and a photosensitive layer disposed between the first electrode and the second electrode, and the first electrode of the photodiode is electrically connected to a gate of the first transistor.

In some embodiments, after forming the first transistor and the second transistor, the manufacturing method further includes a step of:
　　forming a first planarization material layer and a first passivation material layer on the first transistor and the second transistor, and performing one patterning process on the first planarization material layer and the first passivation material layer to form a first through hole penetrating through the first planarization material layer and the first passivation material layer; and
　　the step of forming the photodiode includes: forming a first electrode material layer of the photodiode and performing a patterning process to form a first connection electrode filling the first through hole and the first electrode of the photodiode.

In some embodiments, the step of forming the first transistor and the second transistor includes:
　　forming a low-temperature polysilicon active layer and a first gate insulating layer on the low-temperature polysilicon active layer;
　　forming the gate of the first transistor and a light-shielding layer of the second transistor by one patterning process;
　　forming a first interlayer insulating layer, a metal oxide active layer, a second gate insulating layer, a gate of the second transistor, and a second interlayer insulating layer, and performing a patterning process on the second interlayer insulating layer to form a third through hole and a fourth through hole that penetrate through the second interlayer insulating layer to expose the metal oxide active layer;
　　forming a photoresist layer on the second interlayer insulating layer, the photoresist layer being disposed in the third through hole and the fourth through hole;
　　patterning the photoresist layer to form a photoresist removal area and a photoresist remaining area;
　　performing etching by using the photoresist layer as a mask to form a second through hole penetrating through the first interlayer insulating layer and the second interlayer insulating layer to expose the gate of the first transistor and form a fifth through hole and a sixth through hole that penetrate through the first interlayer insulating layer, the second interlayer insulating layer, and the first gate insulating layer to expose the low-temperature polysilicon active layer of the second transistor;
　　cleaning a surface of the low-temperature polysilicon active layer exposed by the fifth through hole and the sixth through hole with hydrofluoric acid;
　　removing the photoresist layer; and
　　forming a source and drain material layer and performing one patterning process to form a source and a drain of the first transistor filling the fifth through hole and the sixth through hole, a second connection electrode filling the second through hole, and a source and a drain of the second transistor filling the third through hole and the fourth through hole.

In some embodiments, an orthographic projection of the light-shielding layer on the base substrate covers an orthographic projection of the metal oxide active layer of the second transistor on the base substrate.

In some embodiments, the step of forming the photodiode includes: sequentially forming an N layer, an I layer, and a P layer by deposition.

In some embodiments, after forming the photodiode, the method further includes:
　　sequentially forming a second planarization layer and a second passivation layer, the second planarization layer and the second passivation layer having a seventh through hole penetrating through the second planarization layer and the second passivation layer; and
　　forming an anode material layer, and performing one patterning process to form a first lead and an anode layer, wherein the first lead is electrically connected to the second electrode of the photodiode through the first through hole.

In some embodiments, the method further includes: forming a light-emitting layer and a cathode layer on the anode layer to form a light-emitting device.

The technical solutions provided by the embodiments of the present disclosure can achieve beneficial effects as below.

The first transistor and the second transistor are connected in series to form one control unit, and the uniformity and stability of the control unit are greatly improved.

In a case where a functional module (e.g., a fingerprint recognition module) is integrated into a display panel, when the photodiode in the fingerprint recognition module is connected to the control unit, the control unit can better receive an electrical signal from the photodiode.

It should be understood that the foregoing general description and the following detailed description are only exemplary and explanatory, and cannot limit the present disclosure.

DETAILED DESCRIPTION

Figure 1:
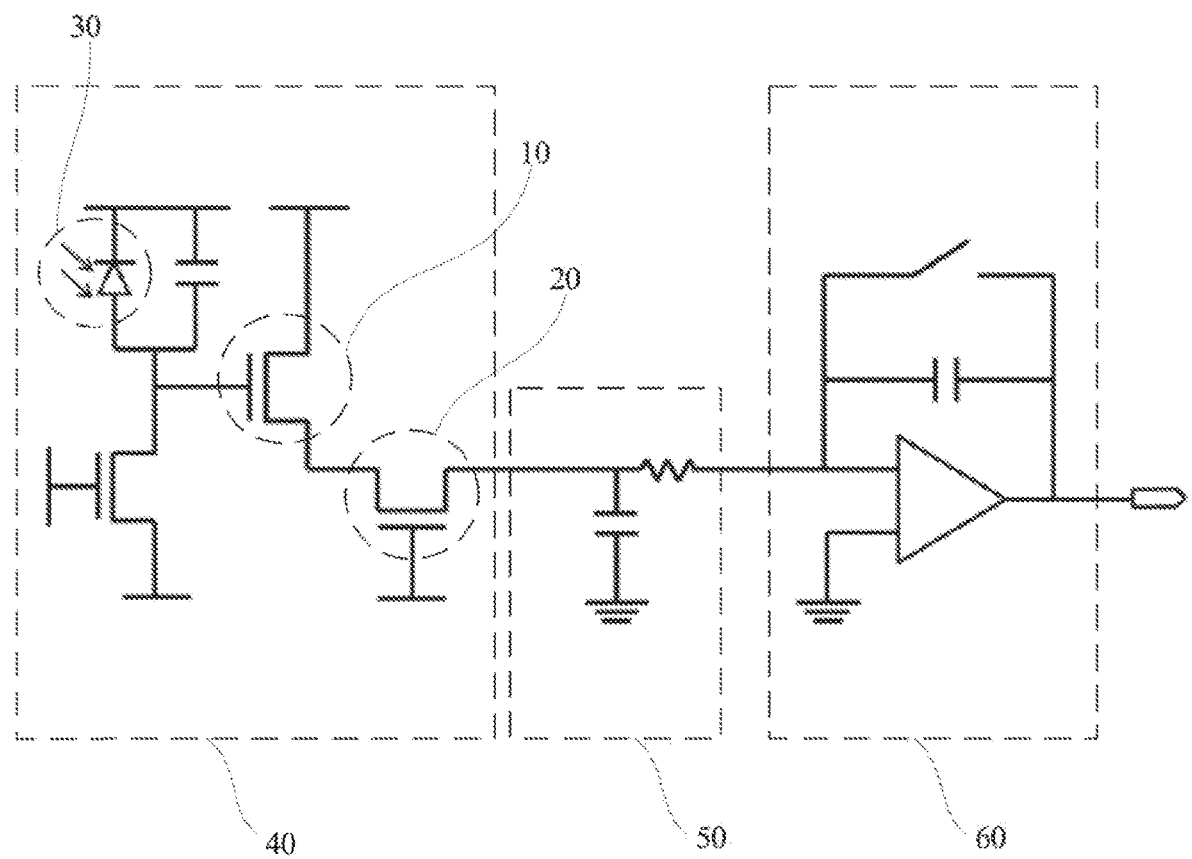
FIG. 1 is circuit diagram of a part of an electronic device according to an embodiment of the present disclosure.

The exemplary embodiments will be described in detail here, and examples thereof are shown in the accompanying drawings. The following description refers to the accompanying drawings in which the same numbers in different drawings represent the same or similar elements unless otherwise indicated. The implementations set forth in the following description of exemplary embodiments do not represent all implementations consistent with the present disclosure. Instead, they are merely examples of apparatuses and methods consistent with aspects related to the present disclosure as recited in the appended claims.

Terms used in the present disclosure are only adopted for the purpose of describing specific embodiments and not intended to limit the present disclosure. Singular forms "a % an," "said" and "the" used in the present disclosure and the appended claims are also intended to include a plural form, unless the context clearly indicates otherwise. It is also to be understood that the term "and/or" used in the present disclosure refers to and includes any or all possible combinations of one or more associated items that are listed.

It should be understood that words such as "first", "second" and the like used in the specification and claims of the present disclosure do not denote any order, quantity or importance, but are only used to distinguish different components. Similarly, words such as "one" or "a/an" do not mean a quantity limit, but mean at least one. Unless otherwise indicated, words such as "front", "back", "lower" and/or "upper" are only for convenience of description, and are not limited to one position or one spatial orientation. Words such as "include/including" or "comprise/comprising" mean that an element or item before "include/including" or "comprise/comprising" covers elements or items listed after "include/including" or "comprise/comprising" and their equivalents without excluding other elements or items. Words such as "connect" or "connection" are not limited to physical or mechanical connections, and may include electrical connections, whether direct or indirect.

The embodiments of the present disclosure will be described in detail below with reference to the accompanying drawings. The following embodiments and features in the implementations can be combined with each other without conflict.

The embodiments of the present disclosure provide an array substrate, which can be applied to an electronic device. The electronic device may be a display device, such as a flexible display device. Of course, the electronic device may also be a display device that cannot be deformed or bent. For example, the electronic device may be a mobile phone, a computer, a display device on a watch, an e-book, etc. In addition, the electronic device may also be other electronic device without a display function. For example, the electronic device may be a device with a fingerprint recognition function.

In the embodiments of the present disclosure, the electronic device may be a display device with a smart display function, which has a display panel, and an array substrate is a component of the display panel. The display panel may be an OLED display panel. Of course, in other embodiments, the display panel may also be an LCD display panel or other display panel.

As shown in FIG. 1, the array substrate includes a control circuit and a photodiode 30. The control circuit includes a first transistor 10 and a second transistor 20, and the first transistor 10 and the second transistor 20 are connected in series, that is, a first electrode of the first transistor 10 is connected to a second electrode of the second transistor 20. One control circuit may be connected to one photodiode 30 to receive an electrical signal generated by the photodiode 30, and may further be connected to a pixel unit at the same time to drive the pixel unit. The photodiode 30 may include a first electrode, a second electrode, and a photosensitive layer disposed between the first electrode and the second electrode. A gate of the first transistor 10 is electrically connected to the first electrode of the photodiode 30 to receive a signal from the photodiode 30. In the embodiment, the photodiode 30 may be a PIN photodiode. In this case, the photosensitive layer may include an N layer, an I layer, and a P layer.

It should be noted that the first transistor 10 includes a source, a drain and a gate, and the second transistor 20 includes a source, a drain and a gate. In the present disclosure, the source, the drain and the gate of the first transistor 10 are referred to as a first source, a first drain and a first gate, and the source, the drain and the gate of the second transistor 20 are referred to as a second source, a second drain and a second gate, the first source and drain and the second source and drain are both composed of the first electrode and the second electrode. In the embodiment, the first electrode is the source and the second electrode is the drain. Of course, in other embodiments, it is possible that the first electrode is the drain and the second electrode is the source. The first electrode of the photodiode 30 may be the cathode of the photodiode 30, and the second electrode of the photodiode 30 may be the anode of the photodiode 30. In the embodiment, the first transistor 10 is a Low Temperature Poly-silicon Thin Film Transistor (LTPS TFT for short), and the second transistor 20 is a metal oxide thin film transistor (Oxide TFT for short). The first transistor 10 and the second transistor 20 being connected in series means that the source of the first transistor 10 is connected to the drain of the second transistor 20, or the drain of the first transistor 10 is connected to the source of the second transistor 20.

In the above arrangement, the first transistor 10 and the second transistor 20 are connected in series to form a control circuit. The uniformity and stability of the control circuit are greatly improved. In a case where a functional module (such as a fingerprint recognition module) is integrated into the array substrate, when the photodiode in the fingerprint recognition module is connected to the control circuit, the control circuit can better receive the electrical signal generated by the photodiode, so that the functional module (such as the fingerprint recognition module) can be better integrated into the display panel to decrease occupation of a bezel space of the display panel by the functional module, thereby increasing the screen-to-body ratio of the display panel to meet user requirements.

Figure 2:
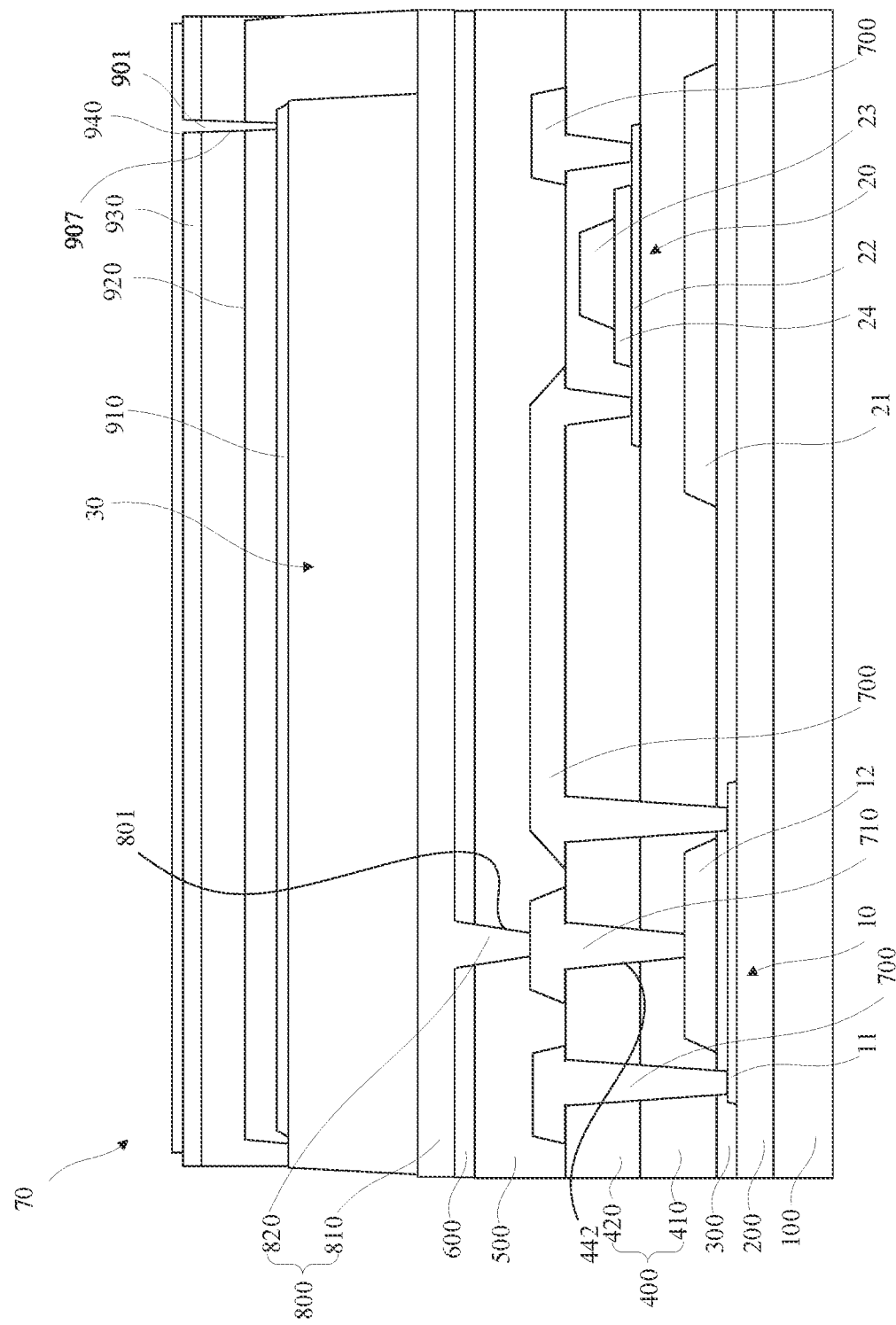
FIG. 2 is a schematic cross-sectional view of a structure of an array substrate according to an embodiment of the present disclosure.
Figure 3:
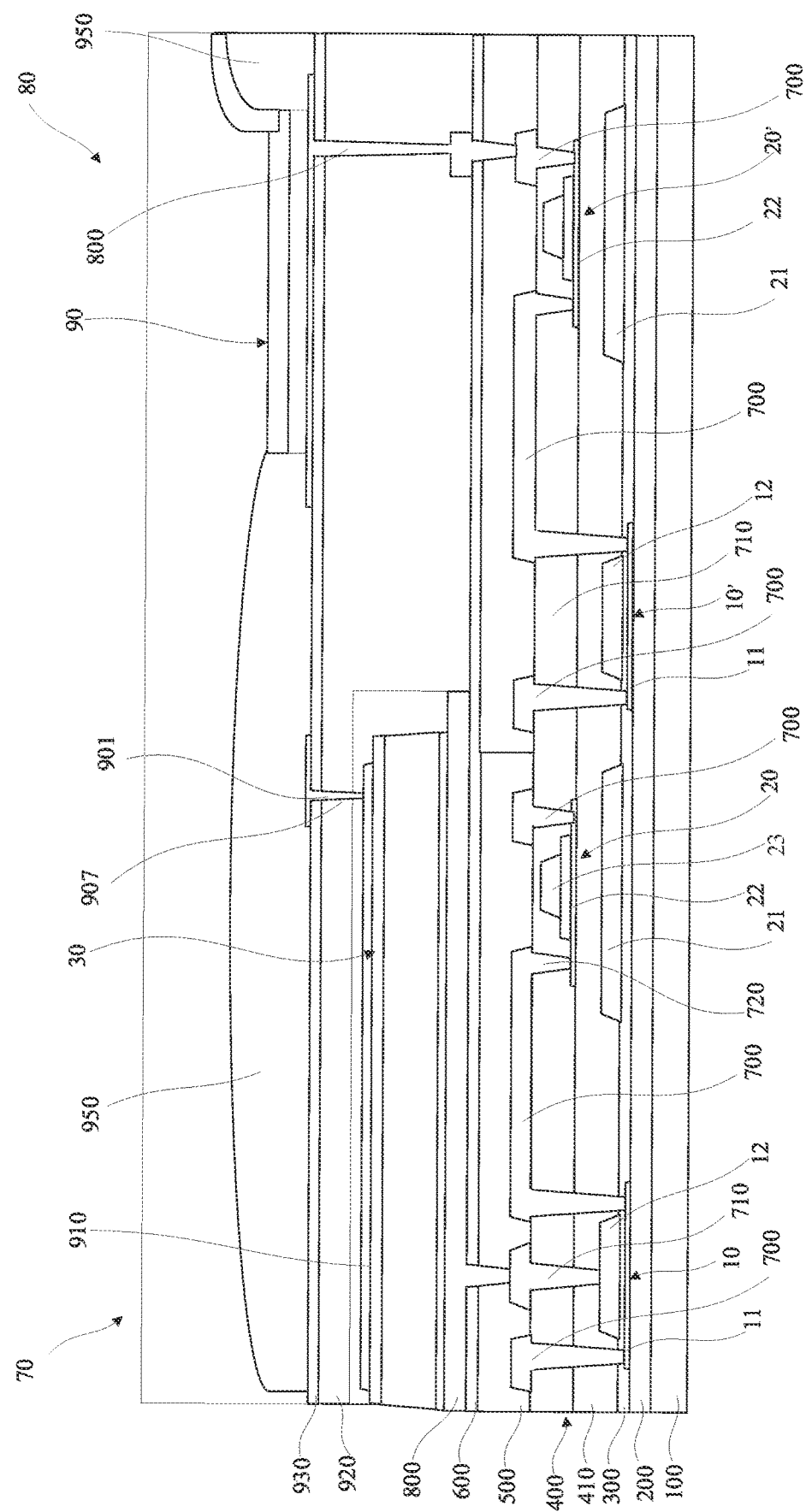
FIG. 3 is a schematic cross-sectional view of a structure of an array substrate according to another embodiment of the present disclosure.
Figure 4:
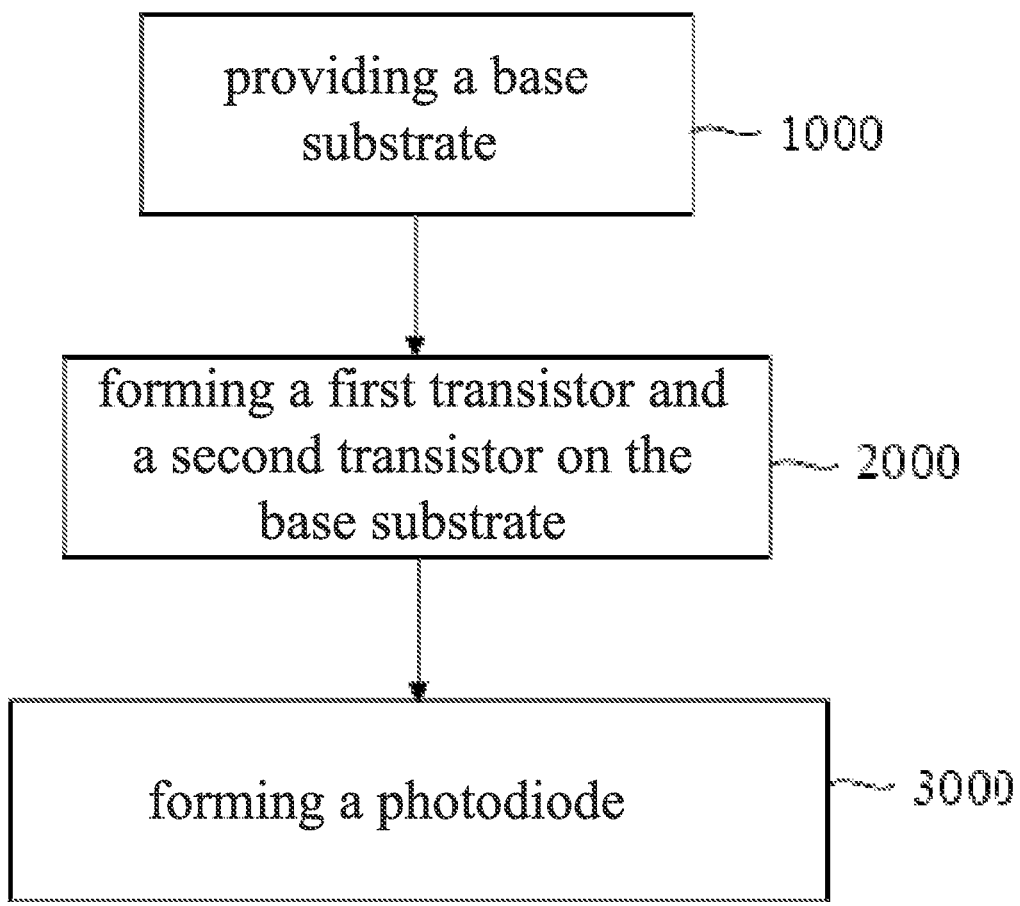
FIG. 4 is a simplified flow chart of a manufacturing method of an array substrate according to an embodiment of the present disclosure.

In some embodiments, as shown in FIGS. 2 to 4, the first transistor 10 and the second transistor 20 are arranged abreast on a base substrate 100. Along a vertically upward direction, the array substrate includes the base substrate 100, a buffer layer 200, a first insulating layer 300, a second insulating layer 400, a first planarization layer 500, and a first passivation layer 600, and other film layer. The second insulating layer 400 includes a first interlayer insulating layer 410 and a second interlayer insulating layer 420. With the first passivation layer 600 and the first planarization layer 500, the dark state current of the photodiode 30 can be reduced, and phenomena such as electric leakage of the photodiode 30 can be avoided. At the same time, a first through hole 801 is provided in the first passivation layer 600 and the first planarization layer 500, and the first through hole 801 penetrates through the first passivation layer 600 and the first planarization layer 500. The first through hole 801 is filled with a first connection electrode 820, and the first electrode of the photodiode 30 is electrically connected to the first gate 12 through the first connection electrode 820 to realize connection between the photodiode 30 and the first transistor 10, so that the first transistor 10 can receive an electrical signal generated by the photodiode 30.

The first transistor 10 is a top-gate transistor and includes a low-temperature polysilicon active layer 11, the first gate 12, the first interlayer insulating layer 410, the second interlayer insulating layer 420, and the first source and drain (the first electrode and the second electrode of the first transistor 10) that are sequentially disposed on the base substrate 100. The low-temperature polysilicon active layer 11 is disposed in the first insulating layer 300, a second through hole 442 is provided in the first interlayer insulating layer 410 and the second interlayer insulating layer 420, a second connection electrode 710 is filled in the second through hole 442, and the second connection electrode is electrically connected to the first connection electrode 820 and the first gate 12, respectively.

The second transistor 20 includes a light-shielding layer 21, a metal oxide active layer 22, the second gate 23, the second interlayer insulating layer 420, and the second source and drain (the first electrode and the second electrode of the second transistor 20) that are sequentially disposed on the base substrate 100. The light-shielding layer 21 and the first gate 12 of the first transistor 10 are arranged in the same layer, and the second source and drain (the first electrode and the second electrode of the second transistor 20), the first source and drain (the first electrode and the second electrode of the first transistor 10) and the second connection electrode 710 are arranged in the same layer. It should be noted that "layers arranged in the same layer" mentioned here means that the layers are formed synchronously, but the layers are not required to have the same height in the vertical direction or the same distance from the base substrate 100.

In some implementations, the second interlayer insulating layer 420, the first interlayer insulating layer 410, and the first insulating layer 300 are provided with a fifth through hole and a sixth through hole, and the fifth through hole and the sixth through hole penetrate through the second interlayer insulating layer 420 and the first interlayer insulating layer 410 and extend to the low-temperature polysilicon active layer 11 in the first insulating layer 300 of the first transistor 10. A third through hole and a fourth through hole are provided in the second interlayer insulating layer 420 to reach the metal oxide active layer 22. The third through hole and the fourth through hole penetrate through the second interlayer insulating layer 420 and extend to the metal oxide active layer 22 of the second transistor 20. The second through hole, the third through hole, the fourth through hole, the fifth through hole, and the sixth through hole are filled with a source and drain material layer for forming the first source and drain and the second source and drain. The source and drain material layer filled in the second through hole serves as the second connection electrode 710, and the source and drain material layer filled in the third through hole, the fourth through hole, the fifth through hole, and the sixth through hole serves as the third connection electrode 720. The third connection electrode 720 in the sixth through hole is connected to the third connection electrode in the third through hole, so that the first source/drain of the first transistor 10 is connected to the second source/drain of the second transistor 20, so as to realize series connection between the first transistor 10 and the second transistor 20.

The first transistor 10 and the second transistor 20 are disposed in the plurality of film layers, and the conductive connection layer 700 (i.e., the layer formed of the source/drain material and including the third connection electrode 720 and the second connection electrode 710) and the metal connection layer 800 (including the first connection electrode 820 and an electrode layer 810, which will be described later) are used to electrically connect the first transistor 10, the second transistor 20 and the photodiode 30. The metal connection layer 800, the first passivation layer 600, the first planarization layer 500, the conductive connection layer 700 and the second insulating layer 400 are disposed between the photodiode 30 and the first transistor 10. At least part of the metal connection layer 800 serves as the first connection electrode 820, and at least part of the conductive connection layer 700 serves as the second connection electrode 710 and the third connection electrode 720.

The conductive connection layer 700 penetrates through the first insulating layer 300 and the second insulating layer 400, and the conductive connection layer 700 is connected to the drain of the first transistor 10 and the source of the second transistor 20, or the conductive connection layer 700 is connected to the source of the first transistor 10 and the drain of the second transistor 20. The metal connection layer 800 penetrates through the first planarization layer 500 and the first passivation layer 600 and includes the electrode layer 810 and the first connection electrode 820. The electrode layer 810 is disposed on the first transistor 10 and the second transistor 20. In the embodiment, the electrode layer 810 is disposed on the first passivation layer 600. The first connection electrode 820 penetrates through the first planarization layer 500 and the first passivation layer 600, one end of the first connection electrode 820 is connected to the first connection electrode 820, and the other end thereof extends downward and is connected to the conductive connection layer 700.

As shown in FIG. 2, the photodiode 30 in the array substrate is disposed on the electrode layer 810 of the metal connection layer 800.

In some implementations, the electrode layer 810 serves as the cathode or a part of the cathode of the photodiode 30, that is, the first electrode (e.g., cathode) of the photodiode 30 is disposed on a side of the photosensitive layer close to the first transistor 10, and the second electrode (e.g., anode) is disposed on a side of the photodiode 30 away from the first transistor 10. With the above arrangement, it is convenient for the first transistor 10 to receive an electrical signal generated by the photodiode 30. Part of the conductive connection layer 700 connected to the first gate of the first transistor 10 serves as the second connection electrode 710, and the downwardly extending end of the first connection electrode 820 extends to the second connection electrode 710, in other words, one end of the first connection electrode 820 is connected to the first gate of the first transistor 10, so that the cathode of the photodiode 30 is connected to the first gate of the first transistor 10.

In this case, the first electrode of the photodiode 3 may be a metal electrode, and an orthographic projection of the first electrode of the photodiode 3 on the base substrate 100 covers orthographic projections of the first transistor 10 and the second transistor 20 on the base substrate 100. That is, an orthographic projection of the electrode layer 810 on the base substrate 100 covers the orthographic projections of the first transistor 10 and the second transistor 20 on the base substrate 100. In the process of manufacturing the array substrate, usually the first transistor 10 and the second transistor 20 are formed first, and then the photodiode 30 is formed on the first transistor 10 and the second transistor 20. However, the manufacturing process of the photodiode 30 will have a great impact on the characteristics of the first transistor 10 and the second transistor 20, especially on the characteristics of the second transistor 20. The manufacturing process of the photodiode 30 includes a deposition process of amorphous silicon. A large amount of hydrogen ions exist during the deposition of amorphous silicon, the metal oxide transistor is very sensitive to hydrogen ions, even a small amount of hydrogen ions will cause a negative bias of the threshold voltage Vth of the metal oxide transistor, and even cause conduction problem of the metal oxide transistor. By setting the size of the electrode layer 810, the orthographic projection of the electrode layer 810 on the base substrate 100 covers the orthographic projections of the first transistor 10 and the second transistor 20 on the base substrate 100. In this way, the electrode layer 810 can protect the first transistor 10 and the second transistor 20 under the electrode layer 810, thereby preventing the manufacturing process of the photodiode 30 from affecting the characteristics of the first transistor 10 and the second transistor 20. At the same time, the area of the electrode layer 810 of the metal connection layer 800 is enlarged, that is, the area of the cathode of the photodiode 30 is enlarged, so that the area of the photodiode 30 is effectively increased and the circuit layout is simplified. In the embodiment, a material of the metal connection layer 800 may be molybdenum (Mo). Of course, in other embodiments, the metal connection layer 800 may also be made of other conductive metal material, as long as it can achieve the functions of blocking hydrogen and connecting the first gate of the first transistor 10 to the photodiode 30.

In some implementations, as shown in FIG. 2, a first conductive film layer 910, a second planarization layer 920, a second passivation layer 930, a second conductive film layer 940, and the like may further be provided on the photodiode 30. The first conductive film layer 910 may serve as the second electrode of the photodiode 30, part of the second conductive film layer 940 is provided on the second passivation layer 930, and the other part thereof penetrates through the second passivation layer 930 and the second planarization layer 920 and is connected to the first conductive film layer 910. In the embodiment, the first conductive film layer 910 and the second conductive film layer 940 may both be indium tin oxide (ITO) films which are transparent and conductive.

When the array substrate described above is applied to a display device, the array substrate further includes a structure for realizing display.

In some embodiments, as shown in FIG. 3, the array substrate is further provided with a light-emitting device 90, a pixel definition layer (PDL for short) 950, a third transistor 10' and a fourth transistor 20'. It should be noted that the third transistor 10' and the first transistor 10 are the same, and both are low-temperature polysilicon transistors, and the fourth transistor 20' and the second transistor 20 are the same, and both are metal oxide transistors. The third transistor 10' and the fourth transistor 20' are connected in the same manner as the manner in which the first transistor 10 and the second transistor 20 are connected. Moreover, the arrangement of film layers in the third transistor 10' is similar to the arrangement of the film layers in the first transistor 10. In addition, along the vertically upward direction, that is, along a direction away from the base substrate 100, the light-emitting device 90 includes an anode layer, an organic light emission layer (EL for short) 91, and a cathode layer 92. The organic light emission layer 91 includes a hole injection layer, a hole transport layer, an organic light emission material layer, an electron transport layer and an electron injection layer. The light-emitting device 90 is disposed on the electrode layer 810 of the metal connection layer 800. In this case, the electrode layer 810 serves as the anode layer or a part of the anode layer of the light-emitting device 90.

The light-emitting device 90 is disposed on a side of the photodiode 30 away from the base substrate 100, and an orthographic projection of the light-emitting device 90 on the base substrate 100 and an orthographic projection of the photodiode 30 on the base substrate 100 do not overlap. With the above arrangement, the light-emitting device 90 is prevented from blocking the photodiode 30, thereby ensuring the detection accuracy of the photodiode 30. For ease of description, an area substantially corresponding to the photodiode 30 is referred to as a recognition area 70 of the array substrate, and an area substantially corresponding to the light-emitting device 90 is referred to as a display area 80 of the array substrate. In some implementations, as shown in FIG. 3, the metal connection layer 800 in the display area 80 is disposed on the second passivation layer 930 and the second planarization layer 920 and above the fourth transistor 20'. At least part of the metal connection layer 800 penetrates through the second passivation layer 930, the second planarization layer 920, the first passivation layer 600, and the first planarization layer 500 and extends to the conductive connection layer 700, so that the third transistor 10' and the fourth transistor 20' can control the light-emitting device 90.

In the display area 80, one pixel unit is connected to one control circuit (including the third transistor 10' and the fourth transistor 20' connected in series), so that the pixel unit is controlled to emit light. In the recognition area, one photodiode is connected to one control circuit (including the first transistor 10 and the second transistor 20 connected in series), so that an electrical signal of the photodiode 30 is received. The control circuit in the display area 80 and the control circuit in the recognition area 70 are the same in structure, but different in function, and are connected to different objects. A second electrode of the third transistor 10' is electrically connected to a first electrode of the fourth transistor 20', and a second electrode of the fourth transistor 20' is connected to the light-emitting device, so as to control the light-emitting device 90.

Further, a first lead 901 is provided on a side of the second passivation layer 930 away from the second planarization layer 920, and a seventh through hole 907 is provided in the second planarization layer 920 and the second passivation layer 930, and the first lead 901 passes through the seventh through hole 907 and is electrically connected to the second electrode of the photodiode 30. The second passivation layer 930 and the second planarization layer 920 can support the light-emitting device 90 in the display area 80 to ensure that the upper surface of the array substrate is at the same level in the display area 80 and the recognition area 70. In addition, the light-emitting device 90 includes a light-emitting layer, a cathode layer and an anode layer, and the anode layer and the first lead 901 are arranged in the same layer. It should be noted that "the anode layer and the first lead 901 being arranged in the same layer" mentioned here means that the anode layer and the first lead 901 are formed simultaneously, and it is not required that the anode layer and the first lead 901 have the same height in the vertical direction or have the same distance from the base substrate 100. The first lead 901 is at least part of the second conductive film layer 940.

In the embodiment, one end of at least part of the conductive connection layer 700 is connected to the source (or drain) of the third transistor 10', and the other end thereof is connected to the drain (or source) of the fourth transistor 20', so as to connect the third transistor 10' to the fourth transistor 20'. The metal connection layer 800 connects the light-emitting device 90 to the third transistor 10' and the fourth transistor 20', so that the voltage of the anode layer of the light-emitting device 90 is controlled by the third transistor 10' and the fourth transistor 20', and further the light-emitting device 90 is driven to emit light. In an embodiment, referring to FIG. 3, the metal connection layer 800 may be connected to the drain of the fourth transistor 20'.

As shown in FIGS. 2 to 4, in a case where the photodiode 30 of the array substrate in the display panel is used to identify fingerprint of a user's finger pressing on the display panel, the display panel emits light and illuminates the fingerprint, and a light signal reflected by the fingerprint reaches the photodiode 30. The photodiode 30 can receive the light signal reflected by the fingerprint and convert the light signal into an electrical signal, which is relatively weak. The first gate of the first transistor 10 is connected to the cathode of the photodiode 30, so that the first transistor 10 can receive the signal from the photodiode 30. Referring to FIG. 1, the photodiode 30, the first transistor 10 and the second transistor 20 form a sensor unit 40, and the sensor unit 40 includes a control circuit formed by the first transistor 10 and the second transistor 20 connected in series. During use, the photodiode 30 in the recognition area 70 receives a light signal and converts the light signal into a weak electrical signal (voltage signal). The first transistor 10 is connected to the photodiode 30, so that the first transistor 10 can receive the electrical signal (voltage signal) generated by the photodiode 30. Since the first transistor 10 is a low-temperature polysilicon transistor, which has a small sub-threshold swing, the first transistor 10 can sensitively sense the voltage signal generated by the photodiode 30 and convert the voltage signal into a current signal, so as to realize amplification of a photosensitive signal from the photodiode 30. The sensor unit 40 outputs the current signal to the outside through a data transmission line 50 and a reading circuit 60 to analyze the current signal and determine matching of fingerprint information, thereby realizing fingerprint unlocking, payment and other operations. Moreover, since the leakage current of a metal oxide transistor is of the order below $10^{-16}$, which is two to three orders of magnitude lower than that of a low-temperature polysilicon transistor. By using the first transistor 10 and the second transistor 20 that are connected in series as a switch in the circuit, the electric leakage in the dark state can be effectively suppressed, that is, the dark state current is relatively low, so that signal difference between the light state and the dark state is increased, and the signal-to-noise ratio is improved. In the display area 80, the sensor unit 40 may drive the light-emitting device 90. By combining the high mobility of the first transistor 10 and the low leakage current of the second transistor 20, designed sizes of the thin film transistors and capacitors can be effectively reduced, which is conducive to achieving high pixel density while reducing the display power of the display panel. With the above arrangement, the recognition area is integrated into a pixel area, so that the pixel area of the display panel can be used for both display and fingerprint recognition, thereby increasing the screen-to-body ratio of the display device.

In some implementations, the first gate 12 of the first transistor 10 is located on the first electrode of the first transistor 10 and the second electrode of the first transistor 10, and the light-shielding layer 21 is disposed under the second transistor 20. The light-shielding layer 21 and the first gate 12 of the first transistor 10 are arranged in the same layer. The first gate 12 of the first transistor 10 and the light-shielding layer under the second transistor 20 may be simultaneously formed by photolithography and etching processes, which reduces the number of masks and simplifies process steps.

In some implementations, an orthographic projection of the light-shielding layer 12 on the base substrate 100 covers an orthographic projection of the semiconductor layer 22 of the second transistor 20 on the base substrate 100. The semiconductor layer 22 of the second transistor 20 is sensitive to light. With the above arrangement, the light-shielding layer can prevent external light from being reflected to the semiconductor layer 22 of the second transistor 20 to ensure normal operation of the second transistor 20.

Compared with a conventionally designed display panel, usually only a metal oxide transistor or a low-temperature polysilicon transistor is provided in a circuit structure. In a case where only the low-temperature polysilicon transistor is provided, electric leakage in the circuit structure is obvious, and the signal-to-noise ratio is small. In a case where only the metal oxide transistor is provided in the circuit structure, when manufacturing, on the metal oxide transistor, a photodiode connected to the metal oxide transistor, the manufacturing process of the photodiode has a relatively large impact on the characteristics of the metal oxide transistor. Therefore, the characteristics of the photodiode and the metal oxide transistor cannot be guaranteed at the same time, and the metal oxide transistor has a large sub-threshold swing, and a weak electrical signal cannot be recognized well, which affects the fingerprint recognition function of the display panel; moreover, since the metal oxide transistor needs to be connected to the pixel unit, the foregoing operation will also affect the display function of the display panel, resulting in degraded display effect and poor fingerprint recognition effect. In the present disclosure, the first transistor 10 and the second transistor 20 are connected to ensure the fingerprint recognition function and display function of the display panel to the greatest extent, and greatly improve the uniformity and stability of the control circuit.

Of course, in other embodiments of the present disclosure, the array substrate of the present disclosure may also be applied to other electronic devices that do not have a display function. For example, the electronic device may be a device having a fingerprint recognition function, and the array substrate may be applied to electronic devices such as a door lock, a car lock, a window lock, etc., as well as other fingerprint readers. When the electronic device is operating, a light-emitting structure (e.g., the light-emitting device in the array substrate or other light-emitting element) emits light so that the light can reach the user's finger, and fingerprint of the finger reflects the light emitted by the light-emitting structure to the photodiode 30, the photodiode 30 can generate a corresponding electrical signal according to the light reflected by the fingerprint of the finger, and transmit the electrical signal to the first transistor 10. In the electronic device as described above, by connecting the photodiode 30 to the control circuit composed of the first transistor 10 and the second transistor 20, the electronic device can accurately identify fingerprint information of the user.

As shown in FIG. 4, and in conjunction with FIG. 2 and FIG. 3 when necessary, the present disclosure also provides a manufacturing method of the above array substrate. The manufacturing method of the array substrate includes the following steps.

Step 1000 includes: providing a base substrate 100.

Step 2000 includes: forming a first transistor 10 and a second transistor 20 on the base substrate 100.

Step 3000 includes: forming a photodiode 30.

A first electrode of the first transistor 10 is connected to a second electrode of the second transistor 20. The first transistor 10 is a low-temperature polysilicon transistor, and the second transistor 20 is a metal oxide transistor. The photodiode 30 includes a first electrode, a second electrode, and a photosensitive layer disposed between the first electrode and the second electrode, and the first electrode is electrically connected to a first gate of the first transistor 10.

With the above arrangement, the first transistor 10 and the second transistor 20 are connected in series. The first transistor 10 receives and amplifies a weak electrical signal emitted by the photodiode 30, the second transistor 20 has a relatively low leakage current, a control circuit formed by connecting the first and second transistors has good uniformity and stability, and normal and stable operation can be ensured when the photodiode 30 is used to identify user's fingerprint.

In some implementations, step 2000 may include the following steps, that is, the step of forming the first transistor 10 and the second transistor 20 may include the following steps.

Figure 5:
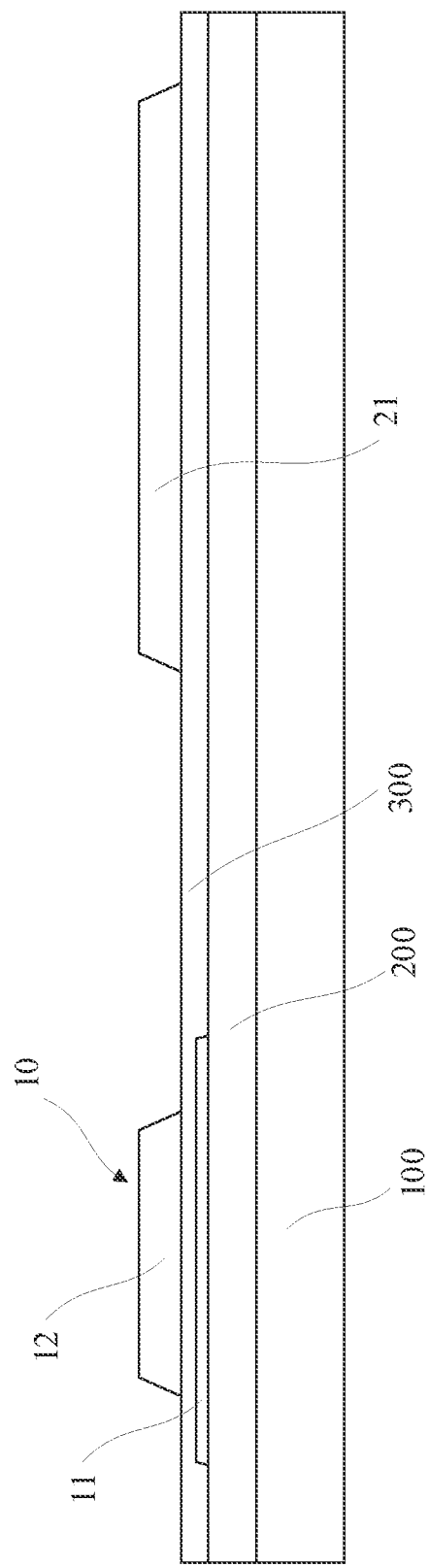
FIG. 5 is a schematic diagram of a cross-sectional structure of an array substrate according to an embodiment of the present disclosure.

Step 2001 includes: forming a low-temperature polysilicon active layer 11 and a first gate insulating layer disposed on the low-temperature polysilicon active layer, as shown in FIG. 5.

Step 2002 includes: forming a first gate 12 of the first transistor 10 and a light-shielding layer 21 of the second transistor 20 by one patterning process, as shown in FIG. 5.

With the above arrangement, the first gate 12 of the first transistor 10 and the light-shielding layer 21 can be formed simultaneously, and the number of times that masks are used and the number of the masks are reduced, thereby simplifying steps and saving costs. Since the material of the semiconductor layer 22 of the second transistor 20 is Indium Gallium Zinc Oxide (IGZO), the semiconductor layer 22 of the second transistor 20 is relatively sensitive to light. By providing the light-shielding layer, external light can be prevented from being reflected to the semiconductor layer 22 of the second transistor 20 to ensure the normal operation of the second transistor 20.

Moreover, in an actual manufacturing process, the manufacturing process of a low-temperature polysilicon transistor involves high temperature process, annealing process and other process, but a metal oxide transistor is not resistant to high temperature. In the present disclosure, the step of forming the first transistor 10 and the step of forming the second transistor 20 are staggered to prevent the manufacturing process of the first transistor 10 and the manufacturing process of the second transistor 20 from being performed simultaneously, that is, the first transistor 10 is formed first, and then the second transistor 20 is formed, which prevents the manufacturing process of the first transistor 10 from affecting the second transistor 20, thereby ensuring the performance of the second transistor 20.

Figure 6:
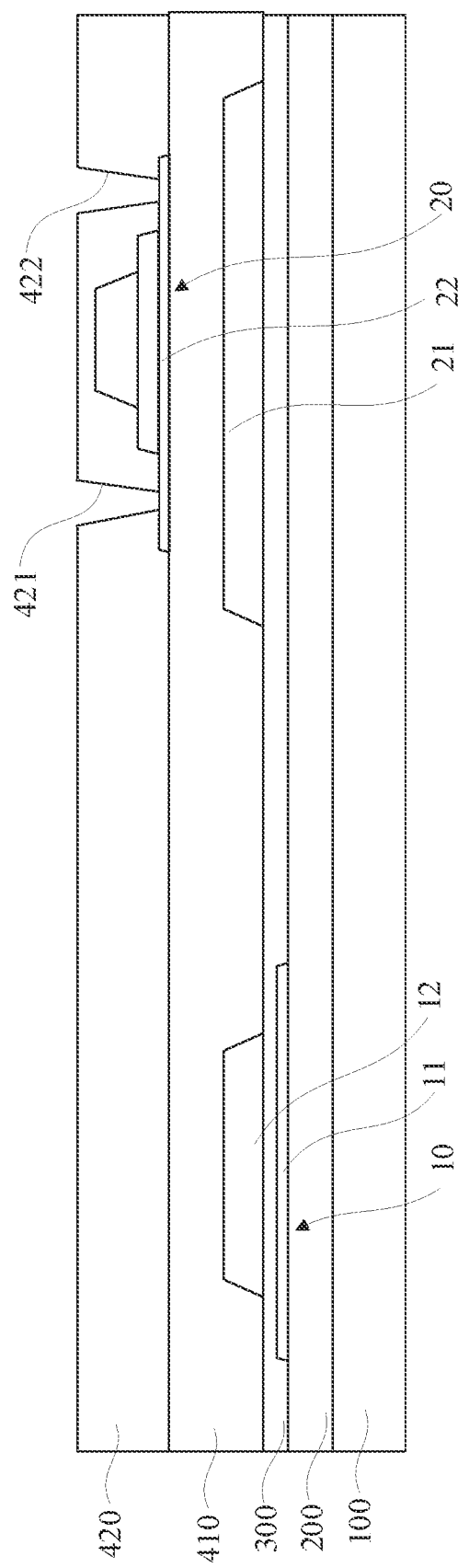
FIG. 6 is a schematic diagram of another cross-sectional structure of an array substrate according to an embodiment of the present disclosure.

Step 2003 includes: forming a first insulating layer 300, a first interlayer insulating layer 410, a metal oxide active layer 22, a second gate insulating layer, a second gate 23 of the second transistor, and a second interlayer insulating layer 420. A patterning process is performed on the second interlayer insulating layer 420 to form a third through hole 421 and a fourth through hole 422 that penetrate through the second interlayer insulating layer 420 and expose the metal oxide active layer 22, as shown in FIG. 6.

Figure 7:
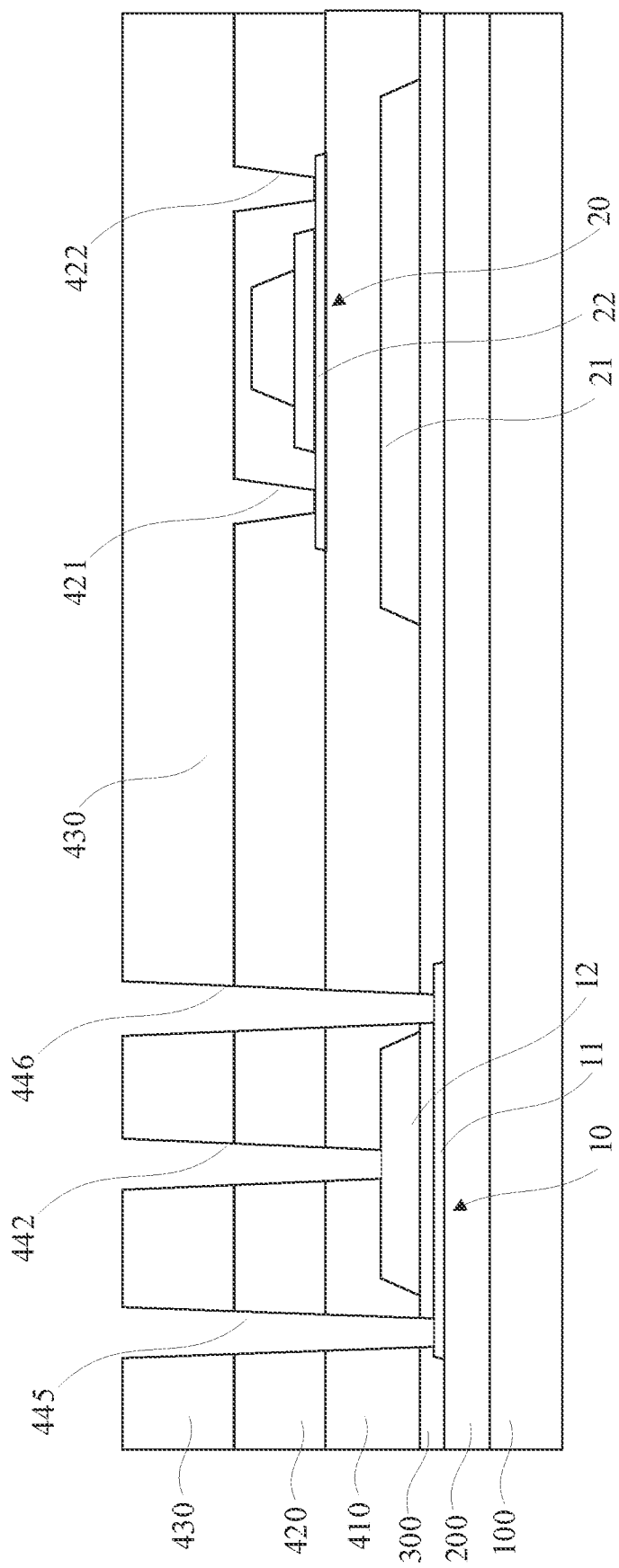
FIG. 7 is a schematic diagram of still another cross-sectional structure of an array substrate according to an embodiment of the present disclosure.

Step 2004 includes: forming a photoresist layer 430 on the second interlayer insulating layer 420, and the photoresist layer 430 is also disposed in the third through hole 421 and the fourth through hole 422, as shown in FIG. 7.

Step 2005 includes: patterning the photoresist layer 430 to form a photoresist removal area and a photoresist remaining area.

Step 2006 includes: performing etching by using the photoresist layer as a mask to form a second through hole 442 that penetrates through the first interlayer insulating layer 410 and the second interlayer insulating layer 420 to expose the first gate 12, and the fifth through hole 445 and the sixth through hole 446 that penetrate through the first interlayer insulating layer, the second interlayer insulating layer and the first gate insulating layer to expose the low-temperature polysilicon active layer, as shown in FIG. 7.

Step 2007 includes: cleaning a surface of the low-temperature polysilicon active layer exposed by the fifth through hole 445 and the sixth through hole 446.

In the above process, the third through hole 421 and the fourth through hole 422 connected to the second transistor 20 are first formed, the third through hole 421 and the fourth through hole 422 are respectively connected to the first electrode and the second electrode of the second transistor 20 to be formed later, and the third through hole 421 and the fourth through hole 422 extend to the metal oxide active layer 22 of the second transistor 20. The metal oxide active layer 22 is located on the first interlayer insulating layer 410. The third through hole 421 and the fourth through hole 422 are filled with the photoresist layer 430. Then, the second through hole 442, the fifth through hole 445, and the sixth through hole 446 are formed. One ends of the fifth through hole 445 and the sixth through hole 446 are connected to the low-temperature polysilicon active layer 11 of the first transistor 10, and the other ends thereof are respectively connected to the source and the drain of the first transistor 10 to be formed later. A cleaning agent is injected into the fifth through hole 445 and the sixth through hole 446 to clean the surface of the low-temperature polysilicon active layer 11 to reduce contact resistance. In the embodiment, the cleaning agent is hydrofluoric acid (HF for short), which has a strong impact on the performance of indium gallium zinc oxide. Therefore, the third through hole 421 and the fourth through hole 422 are sealed using the photoresist layer 430, so as to prevent the cleaning agent from contacting with the semiconductor layer 22 of the second transistor 20. This allows the cleaning agent to clean the surface of the low-temperature polysilicon active layer 11 of the first transistor 10 without affecting the performance of the second transistor 20.

Step 2008 includes: removing the photoresist layer.

Figure 8:
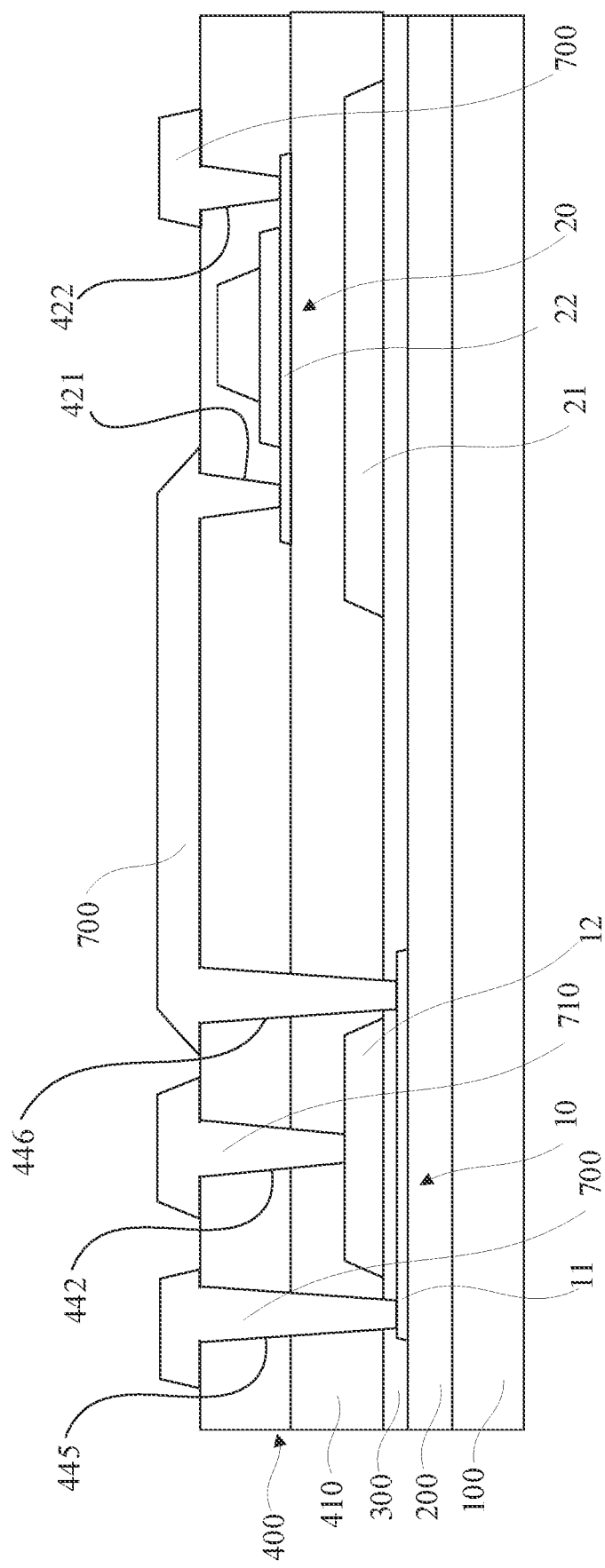
FIG. 8 is a schematic diagram of yet another cross-sectional structure of an array substrate according to an embodiment of the present disclosure.

Step 2009 includes: forming a source and drain material layer and performing one patterning process to form a first source and a first drain filling the fifth through hole 445 and the sixth through hole 446, a second connection electrode filling the second through hole 442, and a second source and a second drain filling the third through hole 421 and the fourth through hole 422, as shown in FIG. 8.

Further, between step 2000 and step 3000, that is, after forming the first transistor 10 and the second transistor 20 on the base substrate 100, and before forming the photodiode 30, the manufacturing method of the array substrate further includes:

step 2100 of: forming a first planarization layer 500 and a first passivation layer 600 on the first transistor 10 and the second transistor 20, and performing one patterning process on the first planarization layer 500 and the first passivation layer 600 to form a first through hole 801 penetrating through the first planarization layer 500 and the first passivation layer 600.

The step of forming the photodiode 30 (i.e., step 3000) may include:

step 3001 of: forming a first electrode material layer of the photodiode 30 and performing a patterning process to form a first connection electrode 820 filling the first through hole 801 and an electrode layer 810. The electrode layer 810 serves as the first electrode 810 of the photodiode 30. Here, the electrode layer 810 is formed such that an orthographic projection of the electrode layer 810 on the base substrate 100 covers orthographic projections of the first transistor 10 and the second transistor 20 on the base substrate 100. In this way, the electrode layer 810 can protect the first transistor 10 and the second transistor 20 located thereunder, and prevent the manufacturing process of the photodiode 30 from affecting the characteristics of the first transistor 10 and the second transistor 20. In the meanwhile, by enlarging the cross-sectional area of the electrode layer 810, the area of the cathode of the photodiode 30 is enlarged, thereby effectively increasing the area of the photodiode 30 and simplifying the circuit layout. With the above arrangement, the photodiode is electrically connected to the first transistor 10 and the second transistor 20, so that the first transistor 10 and the second transistor 20 can receive and process signals generated by the photodiode.

In an embodiment, the step of forming the photodiode 30 (i.e., step 3000) may include:

step 3002 of: sequentially forming an N layer, an I layer, and a P layer by deposition; and step 3003 of: forming a second electrode of the photodiode 30 using a conductive material.

In an embodiment, the material of the N layer may be PH3 doped amorphous silicon, and the thickness of the N layer may be in the range of 5 nm to 10 nm. The material of the I layer may be amorphous silicon, and the thickness of the I layer may be in the range of 500 nm to 1000 nm. The material of the P layer may be B2H6 doped amorphous silicon, and the thickness of the P layer may be in the range of 5 nm to 10 nm. The conductive material forming the second electrode of the photodiode 30 may be ITO, and the thickness of the formed second electrode of the photodiode 30 may be in the range of 20 nm to 80 nm.

In some implementations, after step 3000, that is, after forming the photodiode 30, the manufacturing method of the array substrate further includes the following steps.

Step 3010 includes: sequentially forming a second planarization layer 920 and a second passivation layer 930, and the second planarization layer 920 and the second passivation layer 930 are provided with a seventh through hole 907 penetrating therethrough, as shown in FIG. 2.

Step 3020 includes: forming an anode material layer, and performing one patterning process to form a first lead 901 and an anode layer. The first lead 901 is electrically connected to the second electrode through the first through hole 907. With the above arrangement, external connection of the second electrode is realized.

When the array substrate is applied to a display device, the manufacturing method of the array substrate further includes the following step of: forming a light-emitting material layer and a cathode layer on the anode layer to form the light-emitting device 90, as shown in FIG. 3.

The embodiments described above are only exemplary embodiments of the present disclosure, and do not limit the present disclosure in any form. Although the present disclosure has been disclosed as above by way of preferred embodiments, it is not intended to limit the present disclosure. Those of ordinary skill in the art can make some changes or modifications to the disclosed technical contents to obtain equivalent embodiments with equivalent changes without departing from the scope of the technical solutions of the present disclosure. Any contents that do not depart from the technical solutions of the present disclosure, and any simple modifications, equivalent changes and modifications made to the above embodiments based on the technical essence of the present disclosure still fall within the scope of the technical solutions of the present disclosure.

What is claimed is:

1. An array substrate, comprising a base substrate, and a first transistor and a second transistor on the base substrate, a first electrode of the first transistor being connected to a second electrode of the second transistor;

wherein the first transistor is a low-temperature polysilicon transistor, and the second transistor is a metal oxide transistor; and the array substrate further comprises a photodiode, the photodiode comprises a first electrode, a second electrode, and a photosensitive layer between the first electrode and the second electrode, and the first electrode of the photodiode is electrically connected to a gate of the first transistor.

2. The array substrate of claim 1, wherein the first electrode of the photodiode is on a side of the photosensitive layer close to the first transistor, the first electrode of the photodiode is a metal electrode, and an orthographic projection of the first electrode of the photodiode on the base substrate covers orthographic projections of the first transistor and the second transistor on the base substrate.

3. The array substrate of claim 2, wherein a first passivation layer and a first planarization layer are sequentially arranged between the photodiode and the first transistor, and a first through hole penetrating through the first passivation layer and the first planarization layer is provided in the first passivation layer and the first planarization layer, the first through hole is filled with a first connection electrode, the first electrode of the photodiode is electrically connected to the gate of the first transistor through the first connection electrode.

4. The array substrate of claim 3, wherein the first transistor is a top-gate transistor, and comprises a low-temperature polysilicon active layer, the gate, a first interlayer insulating layer, a second interlayer insulating layer, and a source and a drain sequentially on the base substrate, a second through hole is provided in the first interlayer insulating layer and the second interlayer insulating layer, the second through hole is filled with a second connection electrode, and the second connection electrode is electrically connected to the first connection electrode and the gate of the first transistor, respectively.

5. The array substrate of claim 4, wherein the second transistor comprises a light-shielding layer, a metal oxide active layer, a gate, the second interlayer insulating layer, and a source and a drain sequentially on the base substrate, the light-shielding layer and the gate of the first transistor are arranged in a same layer, and the source and the drain of the second transistor, the source and the drain of the first transistor, and the second connection electrode are arranged in a same layer.

6. The array substrate of claim 5, wherein an orthographic projection of the light-shielding layer on the base substrate covers an orthographic projection of the metal oxide active layer of the second transistor on the base substrate.

7. The array substrate of claim 1, wherein the photodiode is a PIN photodiode.

8. The array substrate of claim 1, further comprising a light-emitting device on a side of the photodiode away from the base substrate, wherein an orthographic projection of the light-emitting device on the base substrate and an orthographic projection of the photodiode on the base substrate do not overlap.

9. The array substrate of claim 8, wherein a second planarization layer and a second passivation layer are sequentially arranged between the light-emitting device and the photodiode, a first lead is on a side of the second passivation layer away from the second planarization layer, the first lead is electrically connected to the second electrode of the photodiode through a seventh through hole penetrating through the second planarization layer and the second passivation layer, the light-emitting device comprises an anode layer, a light-emitting layer, and a cathode layer, and the anode layer and the first lead are arranged in a same layer.

10. The array substrate of claim 8, further comprising a third transistor and a fourth transistor, wherein the third transistor is a low-temperature polysilicon transistor, the fourth transistor is a metal oxide transistor, a second electrode of the third transistor is electrically connected to a first electrode of the fourth transistor, and a second electrode of the fourth transistor is electrically connected to the light-emitting device.

11. An electronic device, comprising the array substrate of claim 1.

12. A manufacturing method of an array substrate, comprising steps of:
providing a base substrate;
forming a first transistor and a second transistor on the base substrate; and
forming a photodiode;
wherein a first electrode of the first transistor is connected to a second electrode of the second transistor;
the first transistor is a low-temperature polysilicon transistor, and the second transistor is a metal oxide transistor; and
the photodiode comprises a first electrode, a second electrode, and a photosensitive layer disposed between the first electrode and the second electrode, and the first electrode of the photodiode is electrically connected to a gate of the first transistor.

13. The manufacturing method of claim 12, further comprising, after forming the first transistor and the second transistor, a step of:
forming a first planarization material layer and a first passivation material layer on the first transistor and the second transistor, and performing one patterning process on the first planarization material layer and the first passivation material layer to form a first through hole penetrating through the first planarization material layer and the first passivation material layer; and
the step of forming the photodiode comprises: forming a first electrode material layer of the photodiode and performing a patterning process to form a first connection electrode filling the first through hole and the first electrode of the photodiode.

14. The manufacturing method of claim 12, wherein the step of forming the first transistor and the second transistor comprises:
forming a low-temperature polysilicon active layer and a first gate insulating layer on the low-temperature polysilicon active layer;
forming the gate of the first transistor and a light-shielding layer of the second transistor by one patterning process;
forming a first interlayer insulating layer, a metal oxide active layer, a second gate insulating layer, a gate of the second transistor, and a second interlayer insulating layer, and performing a patterning process on the second interlayer insulating layer to form a third through hole and a fourth through hole that penetrate through the second interlayer insulating layer to expose the metal oxide active layer;
forming a photoresist layer on the second interlayer insulating layer, the photoresist layer being disposed in the third through hole and the fourth through hole;
patterning the photoresist layer to form a photoresist removal area and a photoresist remaining area;
performing etching by using the photoresist layer as a mask to form a second through hole penetrating through the first interlayer insulating layer and the second interlayer insulating layer to expose the gate of the first transistor and form a fifth through hole and a sixth through hole that penetrate through the first interlayer insulating layer, the second interlayer insulating layer, and the first gate insulating layer to expose the low-temperature polysilicon active layer of the second transistor;
cleaning a surface of the low-temperature polysilicon active layer exposed by the fifth through hole and the sixth through hole with hydrofluoric acid;
removing the photoresist layer; and
forming a source and drain material layer and performing one patterning process to form a source and a drain of the first transistor filling the fifth through hole and the sixth through hole, a second connection electrode filling the second through hole, and a source and a drain of the second transistor filling the third through hole and the fourth through hole.

15. The manufacturing method of claim 14, wherein an orthographic projection of the light-shielding layer on the base substrate covers an orthographic projection of the metal oxide active layer of the second transistor on the base substrate.

16. The manufacturing method of claim 12, wherein the step of forming the photodiode comprises: sequentially forming an N layer, an I layer, and a P layer by deposition.

17. The manufacturing method of claim 12, further comprising, after forming the photodiode, steps of:
sequentially forming a second planarization layer and a second passivation layer, the second planarization layer and the second passivation layer being provided with a seventh through hole penetrating through the second planarization layer and the second passivation layer; and
forming an anode material layer, and performing one patterning process to form a first lead and an anode layer, wherein the first lead is electrically connected to the second electrode of the photodiode through the first through hole.

18. The manufacturing method of claim 17, further comprising: forming a light-emitting layer and a cathode layer on the anode layer to form a light-emitting device.

* * * * *